(12) United States Patent
Yang et al.

(10) Patent No.: US 6,297,147 B1
(45) Date of Patent: *Oct. 2, 2001

(54) PLASMA TREATMENT FOR EX-SITU CONTACT FILL

(75) Inventors: Lisa Yang, San Jose; Anish Tolia, Santa Clara; Roderick Craig Mosely, Pleasanton, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/092,811

(22) Filed: Jun. 5, 1998

(51) Int. Cl.$^7$ .................................................. H01L 21/4763
(52) U.S. Cl. .......................... 438/627; 438/628; 438/643; 438/644; 438/648; 438/653; 438/654; 438/656; 438/683; 438/658; 438/687; 438/688
(58) Field of Search ..................................... 438/627, 628, 438/643, 644, 648, 653, 654, 656, 683, 685, 687, 688

(56) References Cited

U.S. PATENT DOCUMENTS

| | | | |
|---|---|---|---|
| 4,028,155 | 6/1977 | Jacob | 156/643 |
| 4,711,698 | 12/1987 | Douglas | 156/643 |
| 4,872,947 | 10/1989 | Wang et al. | 156/643 |
| 5,000,819 | 3/1991 | Pedder et al. | 156/643 |

(List continued on next page.)

FOREIGN PATENT DOCUMENTS

| | | | |
|---|---|---|---|
| 0430303 | 6/1991 | (EP) | H01L/21/285 |
| 0520519 | 12/1992 | (EP) | H01J/37/326 |
| 0553961 | 8/1993 | (EP) | H01L/21/311 |
| 0849779 | 6/1998 | (EP) | H01L/21/306 |
| 2283461 | 5/1995 | (GB) | C04B/41/53 |
| 2712119 | 5/1995 | (FR) | H01L/21/306 |
| 2 290 166 A | 12/1995 | (GB) | H01L/21/3213 |
| 2 319 532 A | 5/1998 | (GB) | C23C/14/58 |
| 2 319 533 A | 5/1998 | (GB) | C23C/14/58 |
| 05235541 | 9/1993 | (JP) | H05K/3/38 |
| 06097111 | 4/1994 | (JP) | H01L/21/28 |

OTHER PUBLICATIONS

Tetsuya Taguwa, Koji Urabe, Makoto Sekine, Yoshiaki Yamada and Takamaro Kikkawa, "Low Contact Resistance Metallization for Gigabit Scale DRAM's Using Fully–Dry Cleaning by Ar/$H_2$ ECR Plasma," IEEE Transactions on Electron Devices, vol. 44, No. 4, Apr. 1997, pp. 588–593.

(List continued on next page.)

*Primary Examiner*—John F. Niebling
*Assistant Examiner*—David A Zarneke
(74) *Attorney, Agent, or Firm*—Thomason, Moser & Patterson, LLP

(57) ABSTRACT

The present invention provides a method and apparatus for filling contacts, vias, trenches, and other patterns, in a substrate surface, particularly patterns having high aspect ratios. Generally, the present invention provides a method for removing oxygen from the surface of an oxidized metal layer prior to deposition of a subsequent metal. The oxidized metal is treated with a plasma consisting of nitrogen, hydrogen, or a mixture thereof. In one aspect of the invention, the metal layer is Ti, TiN, Ta, TaN, Ni, NiV, or V, and a subsequent wetting layer is deposited using either CVD techniques or electroplating, such as CVD aluminum (Al) or electroplating of copper (Cu). The metal layer can be exposed to oxygen or the atmosphere and then treated with a plasma of nitrogen and/or hydrogen in two or more cycles to remove or reduce oxidation of the surface of the metal layer and nucleate the growth of a subsequent metal layer thereon.

25 Claims, 4 Drawing Sheets

U.S. PATENT DOCUMENTS

| | | | |
|---|---|---|---|
| 5,232,871 | * 8/1993 | Ho | 437/190 |
| 5,248,636 | 9/1993 | Davis et al. | 437/225 |
| 5,266,154 | 11/1993 | Tatsumi | 156/643 |
| 5,409,543 | 4/1995 | Panitz et al. | 134/2 |
| 5,423,941 | 6/1995 | Komura et al. | 156/643.1 |
| 5,424,246 | 6/1995 | Matsuo et al. | 437/192 |
| 5,458,907 | 10/1995 | Ishido | 427/96 |
| 5,476,182 | 12/1995 | Ishizuka et al. | 216/68 |
| 5,527,718 | 6/1996 | Seita et al. | 437/11 |
| 5,572,072 | * 11/1996 | Lee | 257/751 |
| 5,607,542 | 3/1997 | Wu et al. | 156/643.1 |
| 5,643,834 | 7/1997 | Harada et al. | 437/210 |
| 5,660,682 | 8/1997 | Zhao et al. | . |
| 5,674,373 | 10/1997 | Negrerie et al. | 205/160 |
| 5,725,938 | 3/1998 | Jin et al. | 428/210 |
| 5,726,097 | 3/1998 | Yanagida | 438/622 |
| 5,843,847 | 12/1998 | Pu et al. | 438/723 |
| 5,877,087 | * 3/1999 | Mosely et al. | 438/656 |
| 5,899,720 | 5/1999 | Mikagi | 438/303 |
| 5,950,083 | 9/1999 | Inoue et al. | 438/233 |
| 5,970,378 | * 10/1999 | Shue et al. | 438/656 |
| 6,033,537 | 3/2000 | Suguro | 204/192.2 |

OTHER PUBLICATIONS

Yashushi sawada, Hiroshi Tamaru, Masuhiro Kogoma, Motoaki Kawase, and Kenji Hashimoto, "The Reduction of Copper Oxide Thin Films With Hydrogen Plasma Generated By An Atmospheric–Pressure Glow Discharge," J. Phys. D: Appl. Phys. 29 (1996), pp. 2539–2544.

PCT International Search Report dated Aug. 27, 1999.

PCT International Search Report for PCT/US 99/10700 dated Aug. 12, 1999, 3 pages.

PCT International Search Report for PCT/US 99/27829, dated Mar. 24, 2000, 7 pages.

* cited by examiner

PLASMA TREATMENT FOR EX-SITU CONTACT FILL

FIELD OF THE INVENTION

The present invention relates to an apparatus and method for forming integrated plug and wire interconnects on a substrate having submicron features. More particularly, the present invention relates to a metallization sequence for forming metal interconnects wherein a barrier or nucleating layer is exposed to oxygen during the sequence.

BACKGROUND OF THE INVENTION

Sub-half micron multilevel metallization is one of the key technologies for the next generation of very large scale integration ("VLSI"). The multilevel interconnects that lie at the heart of this technology require planarization of high aspect ratio features such as plugs and other interconnects. Reliable formation of these interconnects is very important to the success of VLSI and to the continued effort to increase circuit density and quality on individual substrates and die.

Conventional chemical vapor deposition (CVD) and physical vapor deposition (PVD) techniques are used to deposit electrically conductive material into the contact holes, vias, trenches, or other patterns formed on the substrate. One problem with conventional processes arises because the contact holes or other patterns often comprise high aspect ratios, i.e., the ratio of the height of the holes to their width or diameter is greater than 1. The aspect ratio of the holes increases as advances in technology yield more closely spaced features.

Referring to FIG. 1, a substrate 10 including a hole 11 formed within an electrically insulative or dielectric layer 12 thereon, such as for example, a silicon dioxide or silicon nitride layer is shown. It is difficult to deposit a uniform metal-containing layer into the high aspect ratio hole 11 because the metal-containing layer often deposits on the sidewalls 14 of the holes and across the width of the hole to eventually converge across the width of the hole before it is completely filled, thus forming voids and discontinuities within the metal-containing material. Thereafter, the high mobility of metal atoms surrounding the voids causes the atoms to diffuse and minimize the surface area of the voids forming circular shaped voids as shown in FIG. 1. These voids and discontinuities result in poor and unreliable electrical contacts.

One method used to reduce the likelihood that voids will form in the contact holes, vias, trenches, or other patterns, is to "planarize" the metal at high temperatures. Formation of a continuous wetting layer on the substrate is the key for successful planarization at high temperatures. It has been previously discovered that a thin conformal aluminum film is a good wetting layer for subsequent physical vapor deposition and planarization techniques performed at high temperature ($\geqq 350°$). One method is the use of a wetting layer deposited using chemical vapor deposition (CVD) techniques, i.e., an aluminum layer, as the planarization wetting layer. Successful CVD Al or Cu deposition has been achieved by initially depositing conformal Ti and TiN layers which function as both a barrier layer and a nucleation layer for improving the CVD layer. Recent experiments show that the Ti and TiN layers do not have to be conformal to improve the deposition and performance of the CVD Al or Cu layer. Similarly, Ta and TaN layers have functioned well as barrier layers and nucleation layers for copper deposition. Successful wetting layers of Ni, NiV, and V have also been used to fill patterns during manufacture of magnetic heads.

Oxidation of metal layers, such as Ti, TiN, Ta, TaN, Ni, NiV, and V, is known to hinder use of the layers for nucleation of subsequent metal layers and can increase the electrical resistance of the combined layers. Thus, successful metallization sequences have typically involved deposition of the wetting layer and subsequent metal layers, e.g., Ti or TiN and aluminum, or Ta or TaN and copper, without exposure to oxygen. The sequential deposition steps can be performed in the absence of oxygen by combining the various deposition chambers on an integrated platform such as the Endura™ processing system which is available from Applied Materials, Inc., of Santa Clara, Calif. However, the various chambers required to perform the deposition sequences operate for significantly different time periods and many of the chambers are underutilized. Arrangement of the various chambers on different integrated platforms would improve productivity except for detrimental exposure to oxygen. Furthermore, oxygen plasma treatment of metal layers, e.g., $O_2$ plasma stuffing of Ti or TiN, and ex situ processes such as furnace annealing and rapid thermal processing (RTP) have known benefits on metal layers, such as enhanced barrier properties, but adversely affect subsequent metal layers, such as by causing deterioration in crystal orientation, grain growth, fill properties, and reflectivity.

Deposition of a thin layer of non-oxidized metal on an oxidized metal layer has been proposed to improve nucleation of the CVD aluminum layer, but requires additional process time and additional deposition chambers. Nucleation of aluminum or copper may be improved if the underlying metal layers, e.g., Ti, TiN, Ta, TaN, Ni, NiV, and V layers, did not contain oxygen near the surface. Thus, there is a need for removing or reducing oxidation of metal layers prior to deposition of a metal layer to fill high aspect ratio contact holes, vias, trenches, and other patterns.

SUMMARY OF THE INVENTION

The present invention provides a method and apparatus for forming an interconnect with application in small feature sizes (such as quarter micron widths and smaller) and which may have high aspect ratios. Generally, the present invention provides a method and apparatus for removing or reducing oxidation of metal nucleation or wetting layers, such as Ti, TiN, Ta, TaN, Ni, NiV, and V, by plasma treatment of the surface with nitrogen, hydrogen, or a combination of nitrogen and hydrogen. The treated surface provides excellent nucleation for metallization by CVD or electroplating during subsequent process sequences for filling contacts, vias, trenches, and other patterns.

In one aspect of the invention, a Ti, TiN, Ta, or TaN barrier layer is formed by depositing the metal layer and stuffing the deposited metal layer with an oxygen plasma. Then a nucleation layer is formed on the surface of the barrier layer by plasma treatment with hydrogen, nitrogen, or a mixture thereof, to remove oxygen and form a discontinuous or thin film of Ti, TiN, Ta, or TaN, denoted hereinafter as an ε layer, having a thickness from about a few atoms to about a few hundred Å. The subsequent metal layer deposited on the ε layer is preferably an aluminum (Al) or copper (Cu) wetting layer deposited using chemical vapor deposition techniques or electroplating techniques. The wetting layer may be deposited using PVD or CVD techniques, preferably PVD techniques to improve film quality and crystal orientation of the resulting film. Thus, the wetting layer can be deposited after exposure of the barrier layer to oxygen. The plasma treated ε layer promotes orientation and morphology of the film by producing a self-aligning effect in the film being deposited on the ε layer.

BRIEF DESCRIPTIONS OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

DETAILED DESCRIPTION OF THE DRAWINGS

The present invention provides a method for forming plugs and interconnects for small feature sizes, such as quarter micron widths that typically have high aspect ratios. Generally, the present invention provides a process for forming a plug or interconnect by depositing a metal layer on a plasma treated metal layer, such as Ti, TiN, Ta, TaN, Ni, NiV, and V. The plasma treated metal layer, denoted as an E layer, can be discontinuous. The metal layer can be deposited in two steps, e.g., including a wetting layer, to fill contacts, vias, trenches, and other patterns to form the plugs and interconnects.

In one aspect of the invention, the metal is deposited on a patterned surface of a substrate to form a barrier or nucleation film using PVD or CVD techniques, preferably PVD techniques to provide a self aligning layer on which a highly oriented film can be grown. The barrier or nucleation film may then be oxidized by transferring the substrate to an ex situ process such as furnace annealing or rapid thermal processing (RTP), or may be oxidized by treatment with a plasma comprising oxygen to improve barrier properties. The substrate is then treated with a plasma consisting of nitrogen, hydrogen, or mixtures thereof, to remove oxidation of the surface of a discontinuous or thin ε layer. The plasma treatment is enhanced at sub-atmospheric pressure by dividing the plasma treatment into cycles and exhausting the chamber between the cycles. Next, a wetting layer, such as aluminum (Al), copper (Cu) or other conducting material, is deposited using chemical vapor deposition techniques or electroplating to provide a generally conformal wetting layer. A metal layer, such as Al or Cu, is then deposited at a low temperature, e.g., ≦380° C., on the wetting layer preferably using physical vapor deposition techniques. However, chemical vapor deposition, electroplating or other metal deposition technique known in the field may be used.

Figure 1:
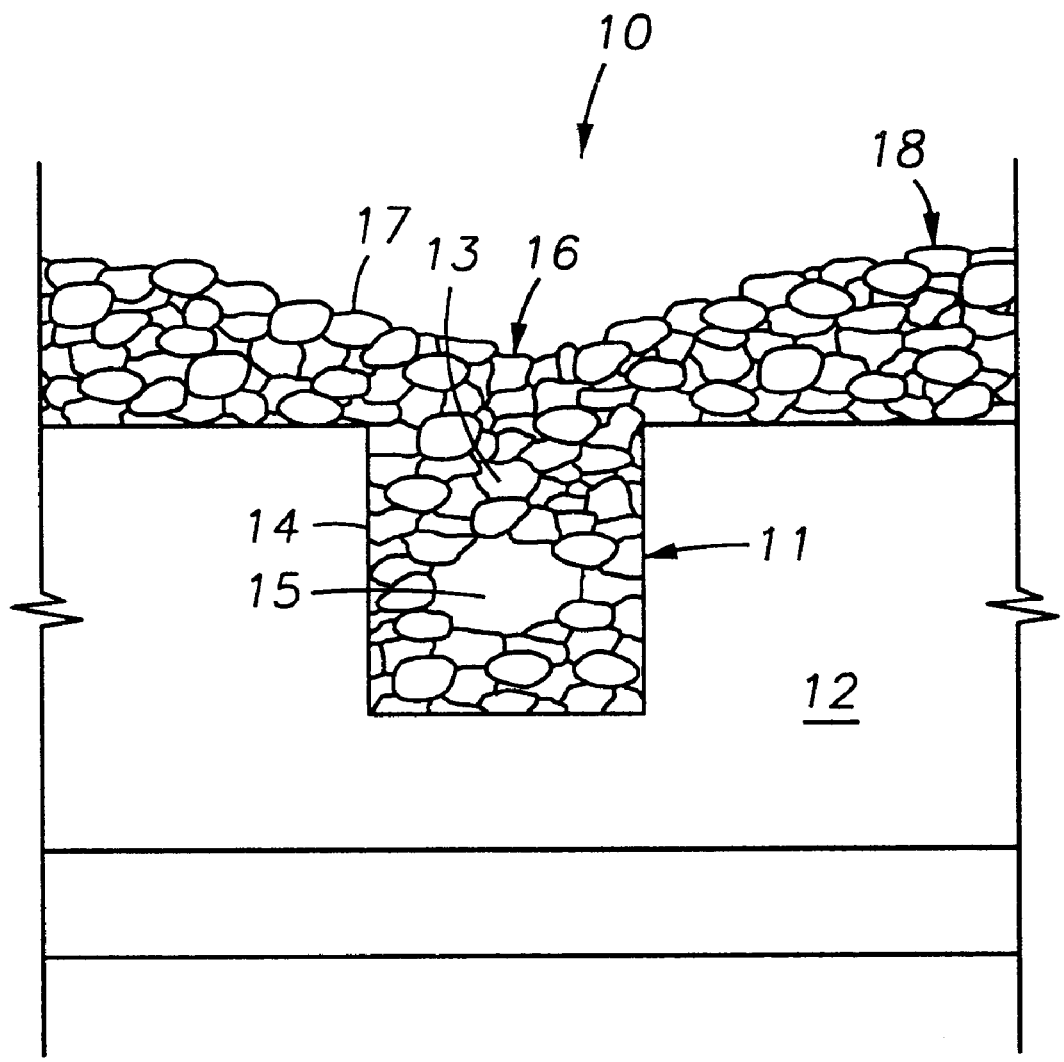
FIG. 1 is a schematic partial sectional view of a prior art substrate showing a randomly-oriented, fine-grained, granular deposition layer in an etched contact hole in the substrate with voids, discontinuities and a non-planar surface.
Figure 2:
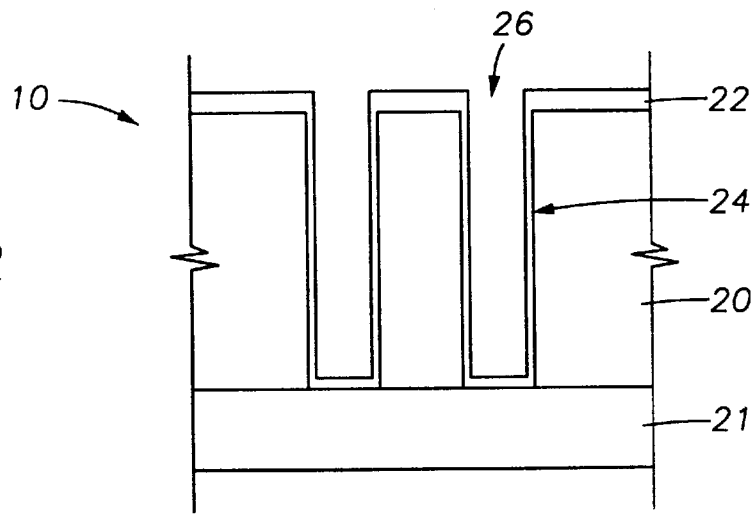
FIG. 2 is a schematic partial sectional view of a substrate processed according to the present invention showing a nucleation layer deposited on the substrate and treated by a $N_2/H_2$ plasma.
Figure 3:
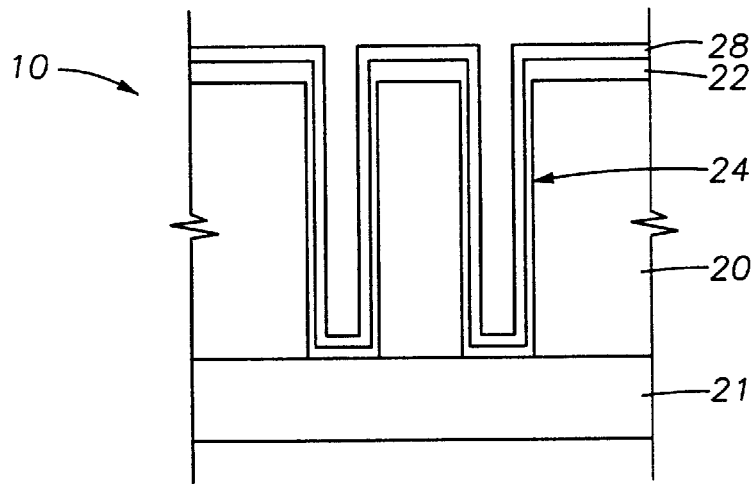
FIG. 3 is a schematic partial sectional view of the substrate of FIG. 2 showing a conformal wetting layer deposited on the substrate.
Figure 4:
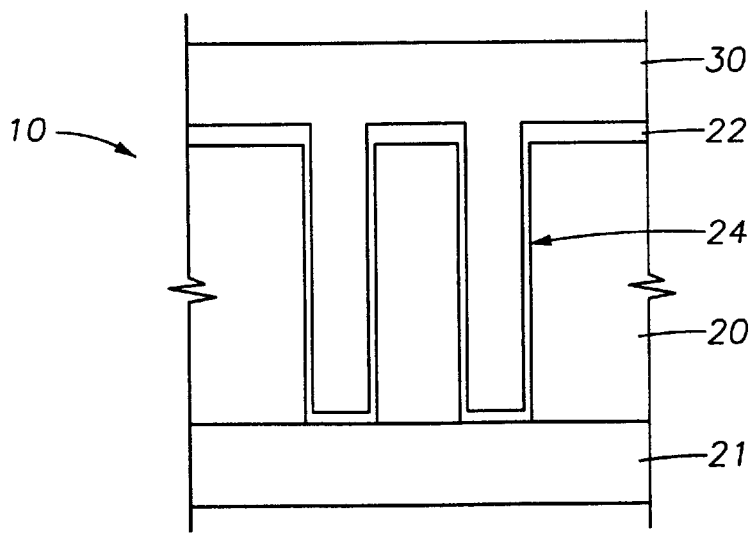
FIG. 4 is a schematic partial sectional view of the substrate of FIG. 3 showing a metal deposited at low temperature on the conformal wetting layer.

FIGS. 2–4 show a cross sectional view of a patterned dielectric 20, such as $SiO_2$, formed on a substrate 21 having the sequential steps of the present invention formed thereon. In accordance with one aspect of the present invention, a thin ε layer 22 is formed on the field of the substrate and in the via 26. Contrary to conventional wisdom, the ε layer can formed after oxidizing the deposited metal by furnace annealing or other oxygen containing processes because the ε layer is treated with the nitrogen/hydrogen plasma to remove oxidation of the surface. In Cu applications and contact applications where the underlying layer is silicon or doped silicon, a continuous barrier layer of TiN is preferably deposited to prevent diffusion of Cu, Al or other metal into the underlying layers. The continuous ε layer is preferably from about 50 Å to about 200 Å in thickness.

Next, a thin wetting layer 28, such as an Al or Cu layer, is deposited using a CVD technique such as a thermal CVD process or electroplating. The wetting layer is deposited on the field and in the contacts, vias, trenches, or other patterned features, to provide good bottom coverage and continuous step coverage in small apertures that may have high aspect ratios. The plugs are then filled using PVD or CVD techniques, preferably PVD techniques such as deposition of a warm PVD Al or Cu layer 30, to provide void-free, low resistivity interconnects. Preferably, the PVD technique is a warm (≦380° C.) metal deposition process which also provides planarization on the field of the structure.

More specifically, the invention will be described below in reference to a method and apparatus to form an aluminum plug and interconnect. However, it is to be noted that the invention is not limited to the particular materials or processes described below. Other materials having similar properties and processes used to deposit these materials may be used to advantage in accordance with the spirit and scope of the invention. First, a thin nucleation layer 22 from about a few atoms to about 200 Å is deposited on a patterned substrate, typically having a dielectric layer exposed. The nucleation layer 22 is preferably comprised of Ti/TiN, but may be comprised of TiN. The nucleation layer 22 may be deposited using CVD or PVD techniques, preferably PVD techniques to enhance the quality of the subsequent films deposited thereon. PVD techniques such as standard, collimated or ion metal plasma (IMP or high density plasma) can be used. IMP provides good bottom coverage in very small high aspect ratio features. The preferred nucleation layer sequence comprises anywhere from a monolayer up to about 200 Å of PVD Ti followed by deposition of anywhere from a monolayer up to about 200 Å of TiN thereon with a total combined thickness of up to about 400 Å. This nucleation layer does not have to be continuous, i.e. the entire patterned surface need not be covered with the nucleating material. A thin, non-continuous nucleating layer enables filling of very small vias.

The substrate can then be transferred to another platform or otherwise exposed to oxygen to oxidize the TiN layer 22. Oxidation of the TiN layer is removed by treatment with a plasma consisting of nitrogen, hydrogen, or mixtures thereof. The plasma is preferably generated by applying from 500 to 2000 W RF at 200 KHz to 16 MHz. The flow of nitrogen preferably ranges from 100 to 500 sccm and the flow of hydrogen preferably ranges from 100 sccm to 500 sccm for 200 mm substrates. The plasma treatment effectively cleans, treat, and/or modifies the TiN surface in 10 to 150 seconds. Preferably the nitrogen/hydrogen plasma is generated in one or more treatment cycles and purged between cycles. Four treatment cycles lasting 35 seconds each has effectively removed oxygen from TiN surfaces that are exposed to an oxygen plasma.

Next, a CVD Al layer 28 is deposited on the nucleation layer using thermal decomposition of DMAH as the precursor gas. Preferably about 100 Å to about 2000 Å (depending on via size) of CVD Al is deposited conformally over the patterned surface to provide a continuous wetting layer 28 for subsequent fill of the patterned features.

Next, a PVD Al layer 30, or other alloy, is deposited using a warm PVD technique at a substrate temperature less than about 380° C. so that warm Al is deposited on the substrate and then flowed into the contact, vias, trenches, and other patterns. The PVD warm Al process is preferably a low temperature deposition process performed at a substrate temperature of less than 380° C. The PVD process is performed by heating the substrate to a temperature in the range of from about 250° C. to about 500° C. A pressure of from about 0.2 mTorr to about 10 mTorr is maintained and a noble gas such as argon is introduced at a flow of from about 5 sccm to about 80 sccm. A DC bias power of from about 100 W to about 20 KW is applied to the target, while the substrate support and the chamber walls are grounded. An aluminum target is sputtered for about 3000 Ws to about 600,000 Ws.

An AlCu film or other doped material may be deposited over the resulting metal layer to allow migration of the Cu or other dopant throughout the metal layer. The process sequence described herein is particularly suitable for depositing a layer of highly oriented crystals of electrically conductive material into high aspect ratio contact holes and vias etched through insulative layers (such as silicon oxide, phosphosilicate glass (PSG) or borophosphosilicate glass (BPSG) layers).

The planarized metal PVD layer is preferably formed at a process temperature greater than about 150° C., most preferably greater than about 250° C., but less than about 380° C. To achieve the planarization of the metal film, the PVD metal film preferably immediately follows deposition of the wetting CVD metal film. The grain growth of the PVD metal layer formed at temperatures greater than about 250° C. exhibit grain growth which absorbs the nodules or other defects that are formed on the field of the substrate during CVD metal deposition to form a highly oriented metal blanket layer. The warm PVD metal layer may include trace amounts of copper or other dopant.

Figure 5:
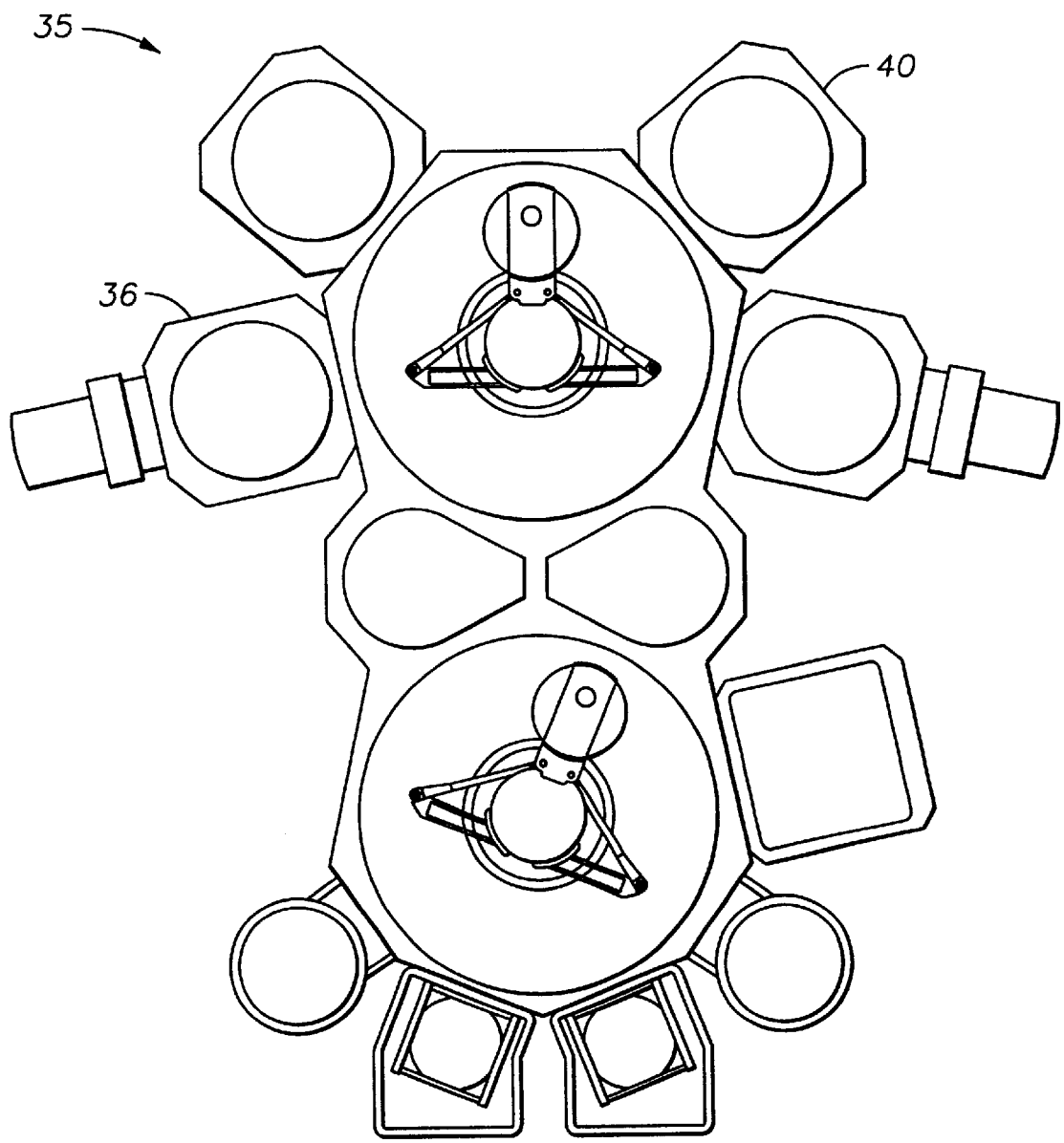
FIG. 5 is a schematic partial sectional view of an integrated multi-chamber apparatus suitable for performing CVD, PVD, and plasma treatment processes on a substrate.

A schematic of a multichamber processing apparatus 35 suitable for performing the CVD, PVD, and plasma treatment process steps of the present invention is illustrated in FIG. 5. The apparatus is an "ENDURA" system commercially available from Applied Materials, Inc., Santa Clara, Calif. The particular embodiment of the apparatus 35 shown herein is suitable for processing planar substrates, such as semiconductor substrates, and is provided to illustrate the invention, and should not be used to limit the scope of the invention. The apparatus 35 typically comprises a cluster of interconnected process chambers, for example, CVD and PVD deposition and rapid thermal annealing chambers.

The apparatus 35 preferably includes at least one enclosed PVD deposition chamber 36 for performing PVD processes, such as sputtering. The PVD chamber 36 comprises a sputtering target (not shown) of sputtering material facing the substrate. The target is electrically isolated from the chamber and serves as a process electrode for generating a sputtering plasma. During the sputtering process, a sputtering gas, such as argon or xenon, is introduced into the chamber 36. A DC bias is applied to the sputtering target, and the support supporting the substrate in the chamber is electrically grounded. The resultant electric field in the chamber 36 ionizes sputtering gas to form a sputtering plasma that sputters the target causing deposition of material on the substrate. In sputtering processes, the plasma is typically generated by applying a DC or RF voltage at a power level of from about 100 to about 20,000 Watts, and more typically from about 100 to 10,000 Watts, to the sputtering target.

Figure 6:
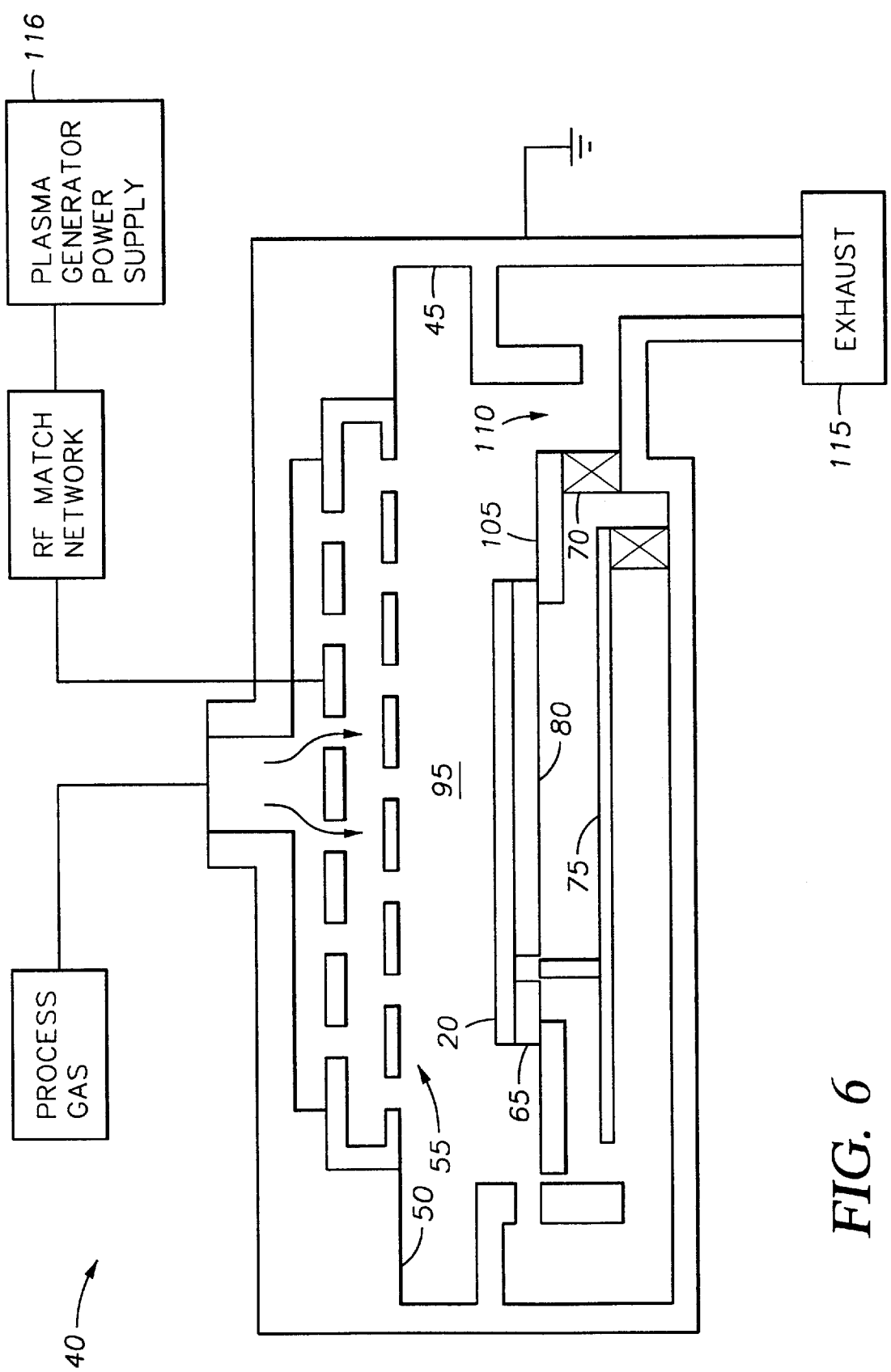
FIG. 6 is a schematic partial sectional view of a CVD deposition chamber suitable for performing a plasma treatment process of the present invention.

The apparatus also comprises a CVD deposition chamber 40 (shown in FIGS. 5 and 6) having surrounding sidewalls 45 and a ceiling 50. The chamber 40 comprises a process gas distributor 55 for distributing delivering process gases into the chamber. Mass flow controllers and air operated valves are used to control the flow of process gases into the deposition chamber 40. The gas distributor 55 is typically mounted above the substrate (as shown), or peripherally about the substrate (not shown). A support 65 is provided for supporting the substrate in the deposition chamber 40. The substrate is introduced into the chamber 40 through a substrate loading inlet in the sidewall 45 of the chamber 40 and placed on the support 65. The support 65 can be lifted or lowered by support lift bellows 70 so that the gap between the substrate and gas distributor 55 can be adjusted. A lift finger assembly 75 comprising lift fingers that are inserted through holes in the support 65 can be used to lift and lower the substrate onto the support to facilitate transport of the substrate into and out of the chamber 40. A thermal heater 80 is then provided in the chamber to rapidly heat the substrate. Rapid heating and cooling of the substrate is preferred to increase processing throughput, and to allow rapid cycling between successive processes operated at different temperatures within the same chamber 65. The temperature of the substrate is generally estimated from the temperature of the support 65.

The substrate is processed in a process zone 95 above a horizontal perforated barrier plate 105. The barrier plate 105 has exhaust holes 110 which are in fluid communication with an exhaust system 115 for exhausting spent process gases from the chamber 40. A typical exhaust system 115 comprises a rotary vane vacuum pump (not shown) capable of achieving a minimum vacuum of about 10 mTorr, and optionally a scrubber system for scrubbing byproduct gases. The pressure in the chamber 40 is sensed at the side of the substrate and is controlled by adjusting a throttle valve in the exhaust system 115.

A plasma generator 116 is provided for generating a plasma in the process zone 95 of the chamber 40 for plasma treatment of the TiN layer or plasma enhanced chemical vapor deposition processes. The plasma generator 116 can generate a plasma (i) inductively by applying an RF current to an inductor coil encircling the deposition chamber (not shown), (ii) capacitively by applying an RF current to process electrodes in the chamber, or (iii) both inductively and capacitively while the chamber wall or other electrode is grounded. A DC or RF current at a power level of from about 750 Watts to about 2000 Watts can be applied to an inductor coil (not shown) to inductively couple energy into the deposition chamber to generate a plasma in the process zone 95. When an RF current is used, the frequency of the RF current is typically from about 400 KHz to about 16 MHz, and more typically about 13.56 MHz. Optionally, a gas containment or plasma focus ring (not shown), typically made of aluminum oxide or quartz, can be used to contain the flow of process gas or plasma around the substrate.

Copper can be deposited on substrates to form lines and interconnects using electroless plating. First, a barrier layer is formed on a patterned substrate using a PVD or CVD method. The barrier layer is comprised of TiN and prevents the diffusion of Cu into the silicon dioxide or other dielectric. In addition, the barrier layer serves as a nucleation layer on which the copper in the electroless plating process is grown. Once the substrate has a barrier layer and a nucleation layer formed thereon, the substrate is introduced into a plating bath where deposition proceeds. The copper is preferably deposited from a tetra-methyl-ammonium-hydroxide (TMAH)-containing solution. The components of one electroless deposition solution are presented below in Table 1.

TABLE 1

| Component | Function | Quantity (Ranges Only) |
| --- | --- | --- |
| $CuSO_4 5H_2O$ | Supply copper ions | 0.05–0.1M |
| $N(CH_3)_4OH$ | Supply electrons | 0.05–1.0M |
| EDTA | Complexing agent | 0.1M |
| HCOH (or alternatively glyoxylic acid) | Reducing agent | 0.01–0.1M |
| $N(CH_3)_4CN$ | complexing agent Affects morphology Surfactant | 0–0.01M |
| GAF RE-610 | Reduces surface tension | 0.5–2% |

Copper deposited from a TMAH-containing solution has been found to yield good quality thin films with a resistivity as low as 1.7 $\mu\Omega$cm. This electroless plating deposition process is further described in a paper entitled "Electroless Copper Deposition for ULSI", Thin Solid Films 262 (1995) pp. 93–103.

EXAMPLE 1

One example of the present invention was performed using two separate ENDURA® platforms available from Applied Materials, Inc. The first platform comprised an IMP titanium chamber and a coherent TiN chamber. The second platform comprised a CVD plasma treatment chamber, a CVD Al chamber, and a PVD Al chamber. A silicon wafer having sub 0.30 $\mu$m contacts, vias, trenches, and other patterns, having an aspect ratio $\geq$4:1 was introduced into the system. About 400 Å of titanium was deposited on the patterned wafer in the Coh—Ti chamber. The Ti serves as a getter material for native oxides formed on the bottom of the interconnect. Next, the wafer was moved into the TiN chamber where 150 Å of TiN was deposited on the Ti layer to provide the barrier and $\epsilon$ layer layers. Next, the wafer was removed from the chamber for 30 minutes to oxidize the TiN layer.

The wafer was then treated with $N_2/H_2$ plasma for 140 seconds using four cycles of 35 seconds each to form the $\epsilon$ layer on the surface of the barrier layer. Reaction products were removed from the chamber after each plasma cycle. The nitrogen flow was 200 sccm and the hydrogen flow was 300 sccm. Plasma was generated with 750 W RF power at 350 kHz. The wafer was then transferred to the CVD Al chamber where 900 Å of Al was deposited on the restored TiN. Finally, the wafer was moved into the PVD Al chamber where 9000 Å of Al was deposited using 2 kW of power for about 260 seconds at a wafer temperature of about 450° C. Electron micrographs show good step coverage and void free fill of contacts, trenches, vias, and other patterns.

EXAMPLE 2 (COMPARISON)

For comparison, Example I was repeated without the $N_2/H_2$ plasma process steps. Electron micrographs show significantly reduced fill performance for the contacts, vias, trenches, and other patterns, likely resulting from reduced nucleation of the CVD Al layer on the oxidized TiN layer.

While the foregoing is directed to the preferred embodiment of the present invention, other and further embodiments of the invention may be devised without departing from the basic scope thereof. The scope of the invention is determined by the claims that follow.

What is claimed is:

1. A method for processing a substrate in a chamber, comprising:

(a) depositing a nucleation layer on the substrate;

(b) exposing the nucleation layer to a plasma generated in the chamber consisting of nitrogen gas, hydrogen gas, or both nitrogen and hydrogen gases, in at least two cycles wherein the plasma in each cycle consists of the same gases; and then (c) depositing a metal layer on the nucleation layer.

2. The method of claim 1 wherein the nucleation layer comprises Ti, TiN, Ta, TaN, Ni, NiV, and V.

3. The method of claim 1 wherein the nucleation layer is deposited by physical vapor deposition.

4. The method of claim 1 wherein the metal layer deposited on the nucleation layer is comprised of a material selected from the group consisting of Al, Cu, and combinations thereof.

5. The method of claim 1, wherein the plasma consists of a mixture of nitrogen and hydrogen.

6. The method of claim 1 wherein the step of depositing a metal layer comprises depositing first a CVD wetting layer and then a PVD conducting layer.

7. The method of claim 1, wherein the nucleation layer and the metal layer are deposited in separate chambers located on different semiconductor processing platforms.

8. A method for processing a substrate, comprising:

(a) depositing a Ti, TiN, Ta, TaN, Ni, NiV, or V barrier layer on the substrate;

(b) exposing the barrier layer to oxygen;

(c) exposing the barrier layer to a plasma consisting of nitrogen gas, hydrogen gas, or both nitrogen and hydrogen gases, in at least two cycles to form a nucleation layer, wherein the plasma in each cycle consists of the same gases;

(d) depositing a wetting layer on the nucleation layer; and (e) depositing a conducting layer on the wetting layer.

9. The method of claim 8 wherein the wetting layer is comprised of Al, Cu, or combinations thereof.

10. The method of claim 1 wherein the conducting layer is comprised of Al, Cu, or combinations thereof.

11. The method of claim 8 wherein the barrier layer is exposed to oxygen by transferring the substrate from a first processing platform comprising a first process zone to a second processing platform comprising a second process zone.

12. The method of claim 8, wherein the barrier layer is exposed to oxygen during treatment of the barrier layer with a plasma comprising oxygen.

13. The method of claim 8, wherein the barrier layer is exposed to oxygen during furnace annealing.

14. The method of claim 8, wherein the plasma consists of a mixture of nitrogen and hydrogen.

15. The method of claim 8, wherein the nucleation layer consists of TiN.

16. The method of claim 8, wherein the conducting layer is deposited at a temperature greater than about 250° C.

17. A method for processing a substrate, comprising:
(a) introducing a substrate into a first process zone;
(b) depositing a Ti layer on the substrate;
(c) introducing the substrate into a second process zone;
(d) depositing a TiN layer on the Ti layer;
(e) oxidizing the TiN layer;
(d) introducing the substrate into a third process zone;
(e) exposing the oxidized TiN layer to a plasma consisting of nitrogen gas, hydrogen gas, or both nitrogen and hydrogen gases in at least two cycles, wherein the plasma in each cycle consists of the same gases;
(f) introducing the substrate into a fourth process zone;
(g) depositing a CVD aluminum layer on the TiN layer;
(h) introducing the substrate into a fifth process zone; and
(i) depositing a PVD aluminum layer on the CVD aluminum layer.

18. The method of claim 17, wherein the TiN layer is oxidized by transferring the substrate from a first processing platform comprising the first process zone and the second process zone to a second processing platform comprising the third process zone.

19. The method of claim 17, wherein the TiN layer is oxidized during treatment of the TiN layer with a plasma comprising oxygen.

20. The method of claim 17, wherein the TiN layer is oxidized during furnace annealing.

21. The method of claim 1, wherein each cycle includes purging the chamber.

22. A method for processing a substrate in a chamber, comprising:
(a) depositing a nucleation layer on the substrate;
(b) exposing the nucleation layer to a first plasma generated in the chamber consisting of nitrogen gas, hydrogen gas, or both nitrogen and hydrogen gases,
(c) purging the chamber;
(d) exposing the nucleation layer to a second plasma generated in the chamber consisting of nitrogen gas, hydrogen gas, or both nitrogen and hydrogen gases, and
(e) depositing a metal layer on the nucleation layer wherein the first plasma and the second plasma consists of the same gases.

23. The method of claim 22, further comprising purging the chamber and exposing the nucleation layer to a third plasma generated in the chamber consisting of nitrogen, hydrogen, or mixtures thereof.

24. The method of claim 23, further comprising purging the chamber and exposing the nucleation layer to a fourth plasma generated in the chamber consisting of nitrogen, hydrogen, or mixtures thereof.

25. A method for processing a substrate in a chamber, comprising;
(a) depositing a nucleation layer on the substrate;
(b) exposing the nucleation layer to oxygen;
(c) exposing the nucleation layer to a plasma generated in the chamber consisting of nitrogen gas, hydrogen gas, or both nitrogen and hydrogen gases, in at least two cycles wherein the plasma in each cycle consists of the same gases; and then
(d) depositing a metal layer on the nucleation layer.

* * * * *

UNITED STATES PATENT AND TRADEMARK OFFICE
CERTIFICATE OF CORRECTION

PATENT NO. : 6,297,147 B1  
DATED : October 2, 2001  
INVENTOR(S) : Yang et al.

It is certified that error appears in the above-identified patent and that said Letters Patent is hereby corrected as shown below:

Title page,  
Item [56], References Cited, OTHER PUBLICATIONS, please replace "sawada" with -- Sawada --.

Column 3,  
Line 36, please replace "Drawings" with -- Invention --.  
Line 44, please replace "E" with -- $\varepsilon$ --.

Column 7,  
Line 66, please replace "I" with -- 1 --.

Column 8,  
Line 50, please replace "1" with -- 8 --.

Signed and Sealed this

Twelfth Day of November, 2002

*Attest:*

JAMES E. ROGAN  
*Attesting Officer*  *Director of the United States Patent and Trademark Office*